(12) United States Patent
Zhu

(10) Patent No.: US 10,063,192 B2
(45) Date of Patent: Aug. 28, 2018

(54) AMPLIFICATION PHASE CORRECTION IN A PULSE BURST

(71) Applicant: MACOM Technology Solutions Holdings, Inc., Lowell, MA (US)

(72) Inventor: Chang Ru Zhu, Corona, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 35 days.

(21) Appl. No.: 15/271,481

(22) Filed: Sep. 21, 2016

(65) Prior Publication Data

US 2017/0012586 A1 Jan. 12, 2017

Related U.S. Application Data

(63) Continuation of application No. 14/471,568, filed on Aug. 28, 2014, now Pat. No. 9,479,122.

(51) Int. Cl.
| | |
|---|---|
| *H03F 1/30* | (2006.01) |
| *H03F 3/189* | (2006.01) |
| *H03F 3/20* | (2006.01) |
| *H03F 1/32* | (2006.01) |
| *G01S 7/03* | (2006.01) |
| *G01S 7/282* | (2006.01) |

(52) U.S. Cl.
CPC ............ *H03F 1/30* (2013.01); *H03F 1/3223* (2013.01); *H03F 1/3247* (2013.01); *H03F 3/189* (2013.01); *H03F 3/20* (2013.01); *G01S 7/032* (2013.01); *G01S 7/282* (2013.01); *H03F 1/301* (2013.01); *H03F 1/302* (2013.01); *H03F 1/3241* (2013.01); *H03F 2200/348* (2013.01); *H03F 2200/451* (2013.01); *H03F 2201/3218* (2013.01)

(58) Field of Classification Search
CPC .. H03F 1/3223; H03F 2201/3218; H03F 1/30; H03F 1/3247; H03F 3/189; H03F 3/20; H03F 2200/451; H03F 1/3241; H03F 2200/348; H03F 1/32; G01S 7/282; G01S 7/032
USPC .................................. 330/75, 149, 270, 290
See application file for complete search history.

(56) References Cited

U.S. PATENT DOCUMENTS

| | | | |
|---|---|---|---|
| 4,639,938 A | 1/1987 | Kennett ........................... 375/60 |
| 5,365,190 A * | 11/1994 | Yu .......................... H03F 1/3223 |
| | | | 330/129 |
| 5,402,085 A * | 3/1995 | Cote ...................... H03F 1/3247 |
| | | | 330/149 |
| 6,445,249 B1 | 9/2002 | Khan ............................. 330/107 |
| 6,512,417 B2 | 1/2003 | Booth ........................... 330/136 |
| 7,091,777 B2 | 8/2006 | Lynch ........................... 330/127 |

(Continued)

OTHER PUBLICATIONS

Frederic Roger, "An Analog Approach to Power Amplifier Predistortion", Microwave Journal Frequency Matters, Apr. 8, 2011, 10 pages.

*Primary Examiner* — Khanh V Nguyen
(74) *Attorney, Agent, or Firm* — Thomas | Horstemeyer, LLP; Michael J. D'Aurelio; Jason M. Perilla

(57) ABSTRACT

An apparatus includes a circuit and a shifter. The circuit may be configured to generate a control signal based on a reference voltage and a plurality of characteristics of an amplifier. The shifter may be configured to (i) receive an input signal carrying a pulse burst having a plurality of pulses, (ii) shift a plurality of phases of the pulses in the pulse burst in response to the control signal, and (iii) present the pulses as shifted in an output signal.

20 Claims, 7 Drawing Sheets

(56) References Cited

U.S. PATENT DOCUMENTS

| | | | |
|---|---|---|---|
| 7,894,772 B2 * | 2/2011 | Aoki | H03C 5/00 |
| | | | 330/296 |
| 7,917,105 B2 | 3/2011 | Drogi | 455/126 |
| 6,326,843 B1 | 12/2011 | Nygren et al. | 330/149 |
| 2003/0117215 A1 | 6/2003 | O'Flaherty | 330/149 |
| 2008/0031382 A1 * | 2/2008 | Aoki | H03C 5/00 |
| | | | 330/278 |
| 2009/0004981 A1 | 1/2009 | Eliezer et al. | 455/127.1 |
| 2010/0041352 A1 * | 2/2010 | Rofougaran | H03C 5/00 |
| | | | 455/114.3 |

* cited by examiner

AMPLIFICATION PHASE CORRECTION IN A PULSE BURST

This application relates to U.S. Ser. No. 15/044,407, filed Feb. 16, 2016, now U.S. Pat. No. 9,571,035, which is incorporated by reference in its entirety.

FIELD OF THE INVENTION

The present invention relates to radio frequency power amplification generally and, more particularly, to a method and/or apparatus for implementing amplification phase correction in a pulse burst.

BACKGROUND OF THE INVENTION

Modern microwave frequency power amplifiers use Gallium Nitrate (i.e., GaN) transistors to amplify signals. However, the GaN transistors trap and release electronics under various conditions. Where the input signal is a burst of several rapid pulses, the trapping effect causes variable delays in the pulses. A first pulse is subjected to a large phase error. Subsequent pulses experience smaller phase errors until steady state conditions are reached. During idle times between bursts, the trapped electrons are released. The resulting uneven phase errors cause problems in several applications, including radar applications.

It would be desirable to implement amplification phase correction in a pulse burst.

SUMMARY OF THE INVENTION

The present invention concerns an apparatus including a circuit and a shifter. The circuit may be configured to generate a control signal based on a reference voltage and a plurality of characteristics of an amplifier. The shifter may be configured to (i) receive an input signal carrying a pulse burst having a plurality of pulses, (ii) shift a plurality of phases of the pulses in the pulse burst in response to the control signal, and (iii) present the pulses as shifted in an output signal.

The objects, features and advantages of the present invention include providing amplification phase correction in a pulse burst that may (i) correct phase errors in each pulse in a burst of multiple pulses due induced by an amplifier, (ii) adjust the corrections for a temperature of the amplifier, (iii) account for process variations during fabrication of the amplifier and/or (iv) operate in the microwave frequency range.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention generally provide a phase modulator (or shifter) that uniquely adjusts a phase of each pulse in a burst of sequential pulses. The phase adjustments are calibrated to cancel errors in the phase of the pulses induced by a subsequent radio frequency power amplifier. The phase modulator and the radio frequency power amplifier generally operate in a millimeter-wave and/or microwave frequency range, for example at tens of gigahertz (e.g., GHz) frequencies. In various embodiments, the signals are in an ultra high radio frequency range (e.g., 300 megahertz to 3 GHz), a super high radio frequency range (e.g., 3 GHz to 30 GHz) and/or an extremely high radio frequency range (e.g., 30 GHz to 300 GHz). Other frequencies and ranges of frequencies may be implemented to meet the criteria of a particular application.

Figure 1:
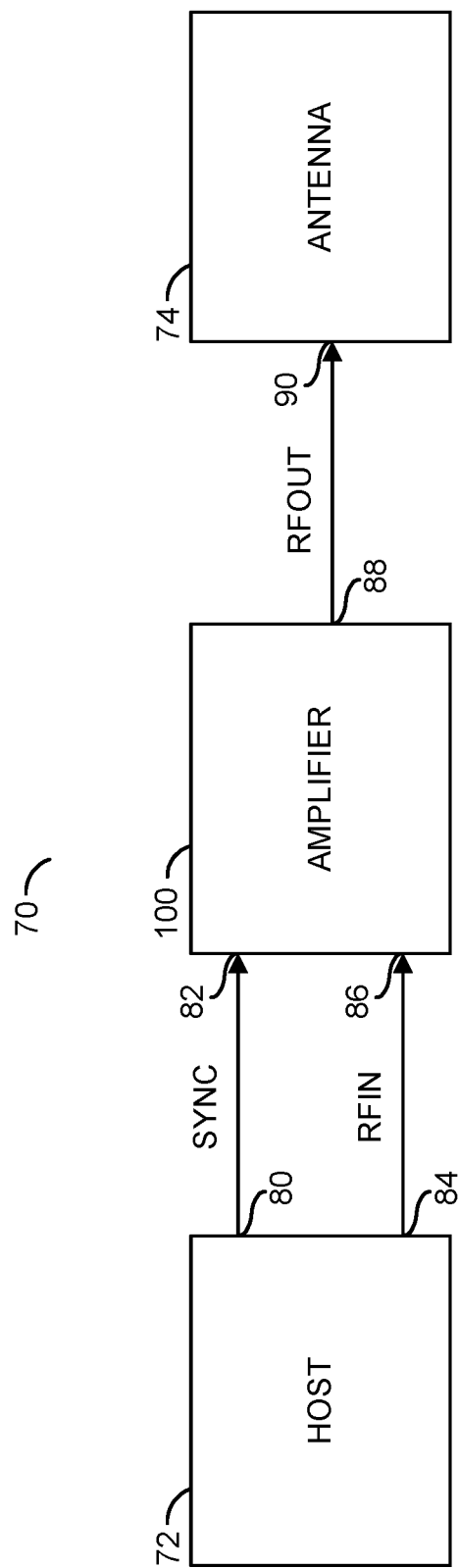
FIG. 1 is a block diagram of a system.

Referring to FIG. 1, a block diagram of a system 70 is shown. The system (or circuit, or apparatus or integrated circuit) generally implements a microwave system. The circuit 70 generally comprises a block (or circuit) 72, a block (or circuit) 74 and a block (or circuit) 100. The circuits 72 to 100 may be implemented in hardware, software executing on hardware, and/or simulated with software.

A signal (e.g., SYNC) may be generated at a port 80 by the circuit 72 and received at a port 82 of the circuit 100. The signal SYNC generally provides synchronization information for the pulse bursts to the circuit 100. An input signal (e.g., RFIN) may be generated at a port 84 of the circuit 72 and received at a port 86 of the circuit 100. The signal RFIN generally implements an input signal that carries a series of pulse bursts to be amplified and presented in a signal (e.g., RFOUT). The signal RFOUT may be presented by the circuit 100 at a port 88 and received by the circuit 74 at a port 90. The signal RFOUT may convey amplified versions of the pulse bursts.

The circuit 72 may implement a host circuit. The circuit 72 is generally operational to create a sequence of pulse bursts in the signal RFIN. The signal RFIN may present pulse bursts at a 60-75 millisecond rate to the circuit 100. Each pulse burst may contain several (e.g., 12-20) pulses. Each pulse may have a 35-45 microsecond period with a 10-20 percent duty cycle. Other rates, durations, numbers, and/or duty cycles of the pulses and the pulse bursts may be implemented to meet the criteria of a particular application. The signal SYNC may also be generated by the circuit 72 to identify where each pulse within the signal RFIN is located in time.

The circuit 74 may implement an antenna circuit. The circuit 74 is generally operational to radiate amplified pulse bursts received in the signal RFOUT. In some embodiments, the circuit 74 may implement a radar antenna. Other antenna configurations may be implemented to meet the criteria of a particular application.

The circuit 100 may implement an amplifier circuit. The circuit 100 is generally operational to amplify the pulse bursts received in the signal RFIN to generate the signal RFOUT. The circuit 100 may include power transistors that are subject to the trapping effect that may shift the phases of the pulses. The circuit 100 may also include correction circuitry that reduces or eliminates variations in the phase shifts caused by the power transistors.

Figure 2:
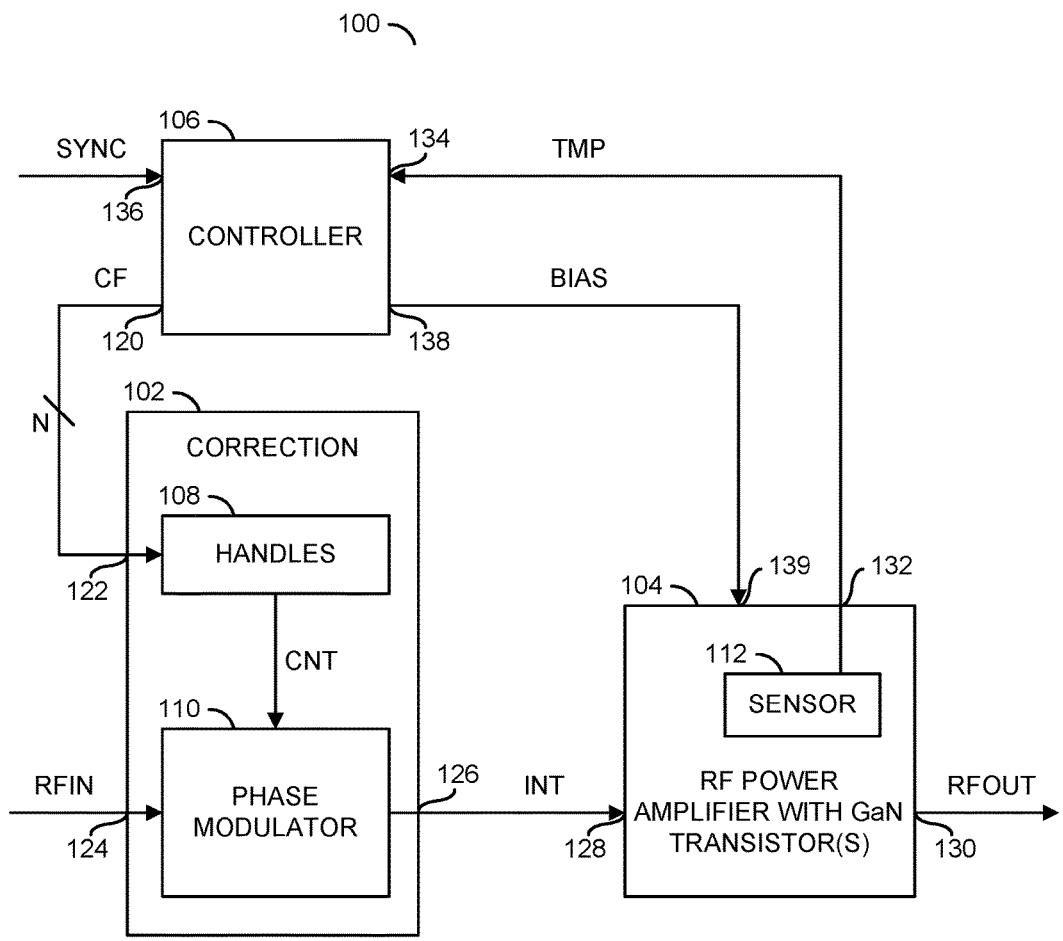
FIG. 2 is a block diagram of an amplifier in the system in accordance with a preferred embodiment of the present invention.

Referring to FIG. 2, a block diagram of the circuit 100 is shown in accordance with a preferred embodiment of the present invention. The circuit (or apparatus, or integrated circuit, or amplifier) 100 generally implements a microwave frequency power amplifier with a phase adjustment capability for a series of pulse bursts. The circuit 100 generally comprises a block (or circuit) 102, a block (or circuit) 104 and a block (or circuit) 106. The circuit 102 generally comprises a block (or circuit) 108 and a block (or circuit) 110. The circuit 104 may include an optional block (or circuit) 112. The circuits 102 to 112 may be implemented in hardware, software executing on hardware, and/or simulated with software.

A signal (e.g., CF) may be generated by the circuit 106 at a port 120 and presented to a port 122 of the circuit 102. The signal CF generally conveys multiple (e.g., N) pieces of configuration data used to control the circuit 102. The signal RFIN may be received by the circuit 102 at a port 124. A signal (e.g., INT) may be generated by the circuit 102 at a port 126 and presented to a port 128 of the circuit 104. The signal INT may implement an intermediate signal used to convey the pulse bursts after the phases of the pulses have been adjusted with correction information or with contents of corrections in addition to the original signal RFIN. The signal RFOUT may be generated at a port 130 of the circuit 104. A signal (e.g., TMP) may be generated by the circuit 104 at a port 132 and presented to a port 134 of the circuit 106. The signal SYNC may be received at a port 136 of the circuit 106. The signal TMP may convey a temperature of the circuit 104 as measured by the circuit 112. A signal (e.g., CNT) may be generated by the circuit 108 and transferred to the circuit 110. The signal CNT may carry control information used to control the phase adjustments of the pulses received in the signal RFIN. A signal (e.g., BIAS) may be generated at a port 138 of the circuit 106 and transferred to a port 139 of the circuit 104. The signal BIAS generally carries bias mode and/or bias level information to the circuit 104.

The circuit 102 may implement a correction circuit. The circuit 102 is generally operational to generate the signal CNT based on a plurality of characteristics of circuit 104. The circuit 102 may also be operational to adjust the phases of the pulses in each pulse burst received in the signal RFIN to generate the signal INT. The adjusting is generally in response to the data in the signal CNT. The phase of the adjusted pulses in the signal INT (relative to in the signal RFIN) generally cancel the phase errors induced by the circuit 104 in the pulses.

The circuit 104 may implement a power amplifier circuit. In various embodiments, the circuit 104 may implement a radio frequency (e.g., RF) power amplifier circuit operating in the microwave and/or millimeter wave frequency ranges. The circuit 104 is generally operational to amplify the pulses/bursts received in the signal INT to generate amplified pulses/bursts in the signal RFOUT. In various embodiments, the circuit 104 may be designed with Gallium Nitride (e.g., GaN) transistors (or devices). Trapping effects within the GaN semiconductor generally cause the phase shifts (errors) in the pulses because electrons are trapped as the pulses are passing through the devices and dissipate in the gaps between the bursts. The resulting induced errors are generally dependent upon the duty cycles of the pulses, the number of pulses in each burst, the positions of the pulses within the bursts, the idle time between bursts, one or more process variations during fabrication, and/or temperature of the transistors (amplifier). The circuit 104 may respond to the signal BIAS to adjust a bias mode and/or a bias level in the amplification circuitry.

The circuit 106 may implement a controller circuit. The circuit 106 is generally operational to generate the signal CF synchronized to the pulses in the signal RFIN. An initial synchronization for the pulses may be provided to the circuit 106 in the signal SYNC. The circuit 106 may generate the signal CF based on the synchronization information received in the signal SYNC. The circuit 106 may store characterization information that characterizes the circuit 104. The stored characterization information is generally used to generate multiple pieces of configuration data. The configuration data may be used by the circuit 102 to adjust the phase of each pulse to counteract (or cancel) subsequent phase errors induced on the pulses in the signal INT by the circuit 104. In various embodiments, the configuration data in the signal CF may be generated simultaneously by the circuit 106. In other embodiments, the configuration data may be staggered to allow slower elements in the circuit 110 to settle to a new configuration before faster elements are changed.

The characterization information may be predefined, multidimensional correction factors based on the characteristics of the GaN devices in the circuit 104. The stored characterization information may be temperature dependent in some embodiments. For example, the data presented in the signal CF may be dependent on the temperature of the circuit 104 as reported in the signal TMP. In various embodiments, multiple (e.g., three or four) pieces of configuration data may be generated by the circuit 106 based on the stored characterization information. Some configuration data may control an RC (e.g., resistor capacitor) time constant of the signal CNT. Other configuration data may control an amplitude of the signal CNT. Still other configuration data may control a timing of the signal CNT. Some configuration data may control a shape (or curve) of the signal CNT. Other configuration data may be implemented to meet the criteria of a particular application. The circuit 106 may also generate the signal BIAS to adjust the amplification circuitry in the circuit 104. In some embodiments, the circuit 106 may be implemented as part of the circuit 72.

The circuit 108 may implement a handles circuit. The circuit 108 is generally operational to generate the signal CNT based on the configuration data received in the signal CF. In some embodiments, the circuit 108 may be implemented in analog circuitry. In other embodiments, the circuit 108 may be implemented with digital circuitry (e.g., a microprocessor, a microcontroller, an application specific integrated circuit, a programmable logic device, etc.). For digital logic implementations, a digital-to-analog converter may be included to generate the signal CNT where the circuit 110 is designed to receive an analog control voltage.

The circuit 110 may implement a phase modulator circuit. The circuit 110 is generally operational to adjust the phase of each pulse received in the signal RFIN based on the control information received in the signal CNT. The circuit 110 may adjust the phase of each pulse individually so that N successive pulses in a burst receive N unique adjustments. The phase adjustments are generally inversions of the phase error curves caused by the circuit 104.

The circuit 112 may implement a temperature sensor circuit. The circuit 112 is generally operation to measure a temperature of the GaN transistors within the circuit 104. The measured temperature may be transferred to the circuit 106 in the signal TMP.

Figure 3:
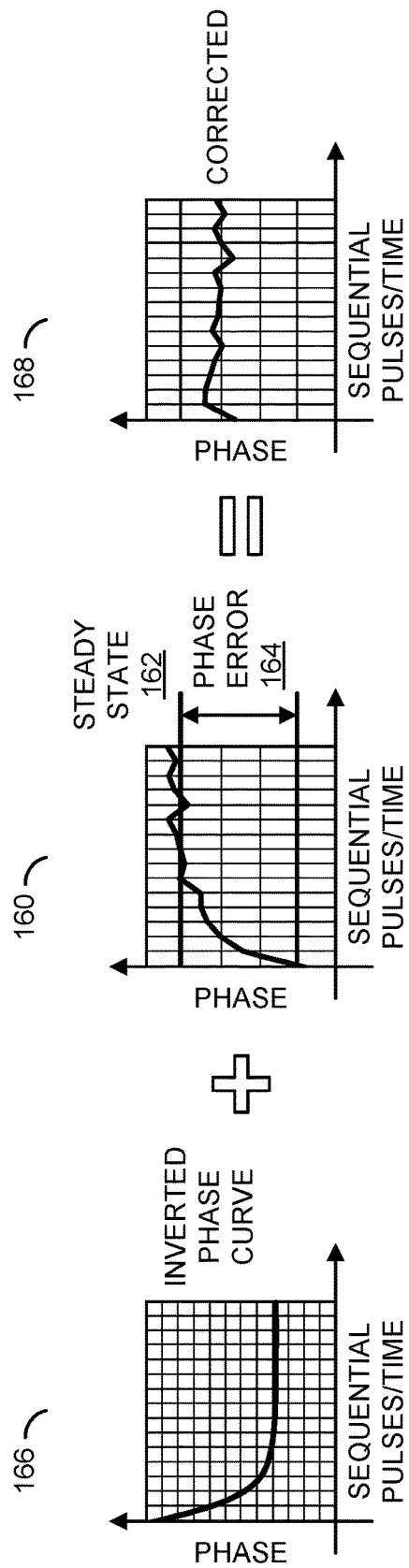
FIG. 3 is a diagram of example phase curves.

Referring to FIG. 3, a diagram of example phase curves is shown. A diagram 160 generally illustrates the phase error (e.g., y-axis) of a sequence of pulses (e.g., x-axis). The phase error starts generally starts at an initial value with an initial pulse in a pulse burst. As more pulses are amplified, the traps in the GaN devices are gradually filled after a certain number of pulses resulting in smaller phase errors. After several pulses, the circuit 104 generally settles the phase shift at a final steady state value 162. A different from the initial phase shift to the final steady state value 162 may be a maximum phase error 164.

To compensate for the phase error introduced by the circuit 104, the circuit 102 may implement an inverse phase curve, as illustrated in diagram 166. A combination of the inverse phase curve in diagram 166 and the phase error curve in the diagram 160 is shown in the diagram 168. The combination generally results in a corrected phase curve. The corrected phase curve shown in the diagram 168 is basically constant from the initial pulse in the burst until the final pulse in the burst.

Figure 4:
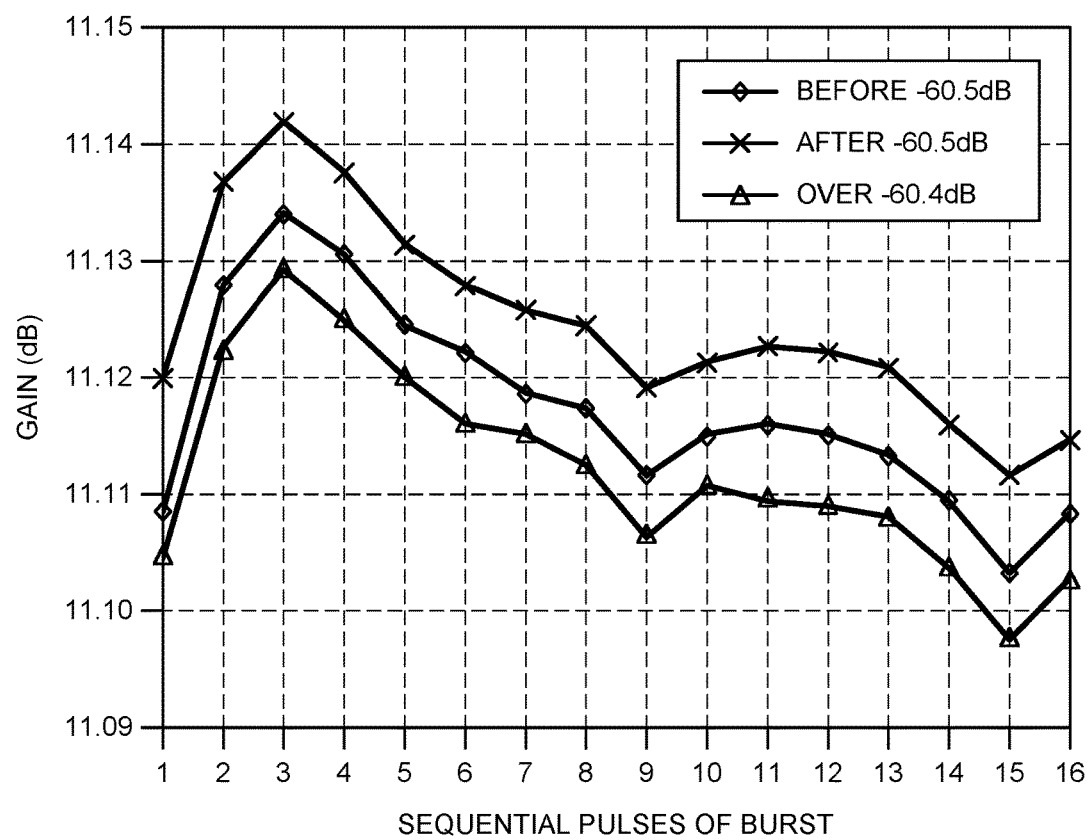
FIG. 4 is a diagram of an example gain curve.

Referring to FIG. 4, a diagram 172 of an example gain curve is shown. The diagram 172 generally illustrates that the circuit 102 causes no impact to the gain/amplitude or the stability of the pulses. The curve BEFORE generally illustrates the amplitudes before (without) correction by the circuit 102. The curve AFTER may illustrate the amplitudes after (with) correction. The curve OVER generally illustrates the amplitudes with correction and over compensation. When the compensation is applied, an absolute gain change for each pulse is small (e.g., about 0.01 dB).

Figure 5:
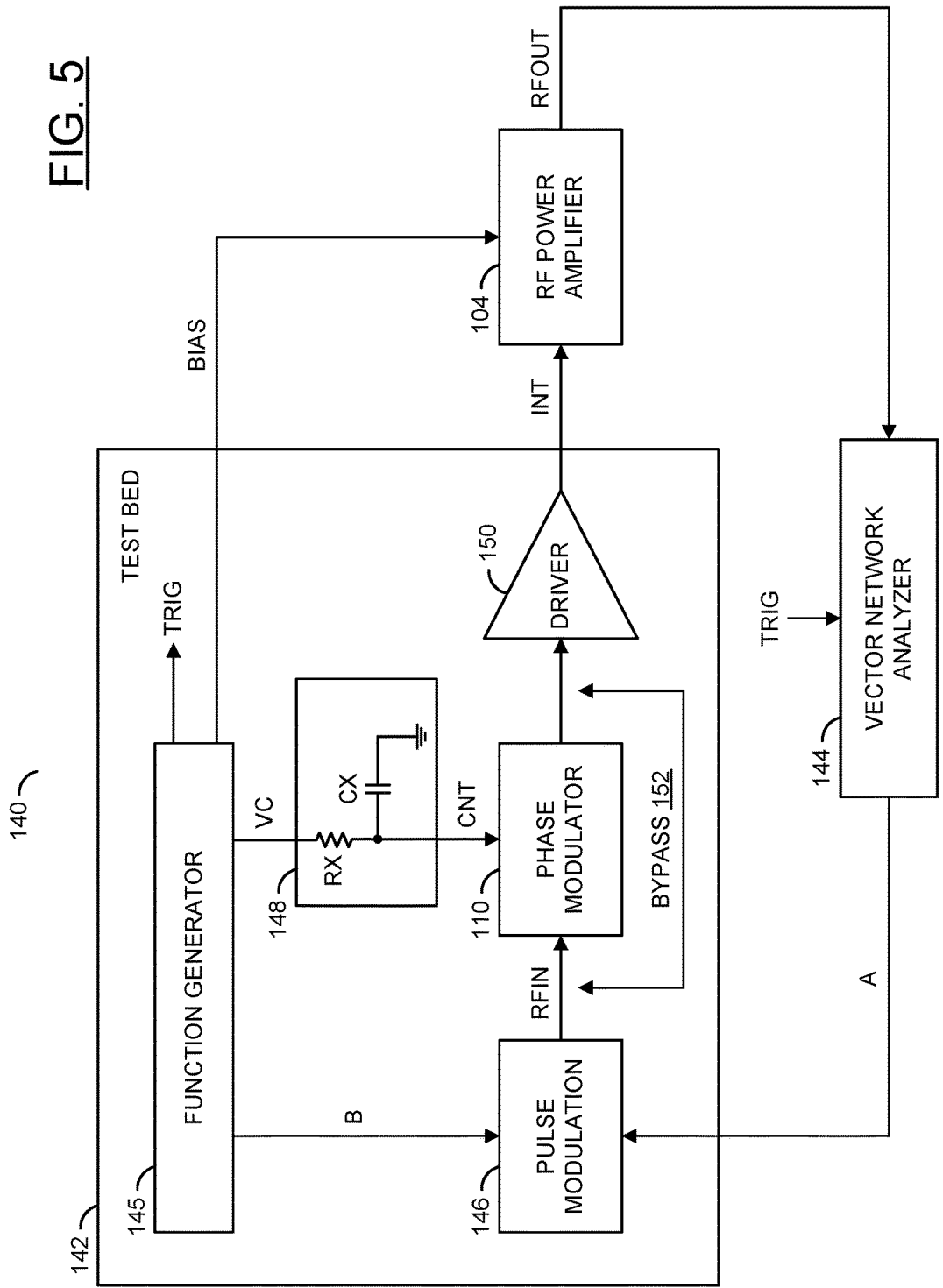
FIG. 5 is a block diagram of a test environment.

Referring to FIG. 5, a block diagram of a system 140 is shown. The system (or circuit or apparatus or system) 140 generally implements a test environment used to characterize the one or more GaN devices in the circuit 104. The system 140 generally comprises the circuit 104, a block (or circuit) 142, and a block (or circuit) 144. The circuit 142 generally comprises the circuit 110, a block (or circuit) 145, a block (or circuit) 146, a block (or circuit) 148, a block (or circuit) 150, and a block (or circuit) 152. The circuits 142 to 152 may be implemented in hardware, software executing on hardware, and/or simulated with software.

A signal (e.g., VC) may be generated by the circuit 145 and presented to the circuit 148. The signal VC may implement a voltage control signal. The signal VC is used to control the shape, width, amplitude and timing of the signal CNT. The circuit 148 may generate the signal CNT. The circuit 146 may generate the signal RFIN. The circuit 150 may generate the signal INT. The signal RFOUT may be received by the circuit 144. A signal (e.g., A) may be generated by the circuit 144 and presented to the circuit 146. The signal A may be a continuous wave generated by the circuit 144. A signal (e.g., B) may be generated by the circuit 145 and presented to the circuit 146. The signal B may be a gating signal used to command the circuit 146 to generate burst mode pulses by modulating the signal A. The circuit 145 may also generate a signal (e.g., TRIG) received by the circuit 144. The signal TRIG generally identifies a start of each pulse created by the circuit 146 in response to the signal B. The signal BIAS may be generated by the circuit 145 and transferred to the circuit 104.

The circuit 142 may implement a test bed circuit. The circuit 142 is operational in a calibration mode (or state) to generate the signal INT without phase corrections to characterize the phase errors caused by the circuit 104. While in the calibration mode, the bypass 152 is enabled to route the pulses in the signal RFIN around the circuit 110 directly to the circuit 150 for generation of the signal INT without correction. With the bypass 152 enabled, the signal VC may be set to a constant (e.g., +5 volts).

The circuit 142 is operational in a test mode (or state) to generate the signal INT with the phase corrections to verify that the characteristics of the circuit 104 are properly captured and applied for generating the inverse curves. While in the test mode, the bypass 152 is disabled such that the pulses in the signal RFIN are adjusted by the circuit 110 prior to the generation of the signal INT by the circuit 150.

Calibration of the circuit 142 generally starts with removal of the circuit 104 and the signal INT is routed to the signal RFOUT. Amplitude and phase calibrations may subsequently be performed. The calibrations generally account for the impact from a less-than-perfect circuit 150. After the initial calibration, the circuit 104 is generally reinserted and the bypass 152 maintained while the circuit 104 is characterized. Characterization generally involves varying a level of the signal A to adjust the power of the signal INT. The signal BIAS may be used adjust the bias mode and/or bias level of the circuit 104 until a resulting amplitude error is sufficiently stable. The phase correction criteria of each pulse in a pulse burst may be recorded.

After the circuit 104 has been characterized, the bypass 152 may be removed. The signal VC is configured as an active low (e.g., +3 volts) pulse with a pulse width matching a time length of a burst. The amplitude of the signal VC (e.g., +5 volts to +3 volts) may be calculated. A time advance or delay relative to the burst is generally calculated and programmed into the circuit 145. Limiting of the signal VC may be added if only an initial few of the pulses are to be corrected. The values of RX and CX may be calculated to form a shape of the signal CNT on the capacitor CX.

The circuit 144 may implement a vector network analyzer. The circuit 144 may include an IQ detection capability with a sequential pulse capability. The circuit 144 is generally operational to measure the phase and amplitude of the pulses created by the circuit 104 between the signal A and the signal RFOUT. Timing to initiate the measurements may be provided through the signal TRIG. The circuit 144 may also be operational to generate the signal A as a known starting signal.

The circuit 145 may implement a function generator circuit. The circuit 145 is generally operational to create the signals B and TRIG to initiate the pulses of a test pulse burst from the circuit 146 (e.g., by modulation), and signal the circuit 144 to measure the resulting amplified pulses. The circuit 145 may also be operational to generate the signal VC to initiate control of the circuit 110 to adjust the phase of the original pulses. The signal BIAS may be generated by the circuit 145 to control the circuitry within the circuit 104.

The circuit 146 may implement a pulse modulator circuit. The circuit 146 is generally operational to create the signal RFIN by modulating the signal A based on the signal B. In various embodiments, the circuit 146 implements a switch signal that switches signal A into the signal RFIN, as controlled by the signal B. Other modulation type circuits may be implemented to meet the criteria of a particular application.

The circuit 148 may implement a filter circuit. The circuit 148 is generally operational to curve form the signal VC to generate the signal CNT. In various embodiments, the curve forming may be similar to that of the circuit 108. In some embodiments, the circuit 148 may be implemented as a low pass RC filter with a resistor RX (e.g., 1,000 ohms) between the signals VC and CNT and a capacitor CX (e.g., 1 microfarad) between the signal CNT and ground. In various embodiments, the circuit 148 may be eliminated where the circuit 145 generates the signal CNT directly.

The circuit 150 may implement a driver circuit. The circuit 150 is generally operational to create the signal INT. In some embodiments, the circuit 150 may provide a sufficient amount of gain, and no gain or no phase variations over the time or pulses such that the pulses in the signal INT are similar to the pulses generated by either the circuit 110 in the test mode or the circuit 146 in the calibration mode. In various embodiments, the circuit 150 may be eliminated such that the circuit 110 is directly connected to the circuit 104, as in the apparatus 100. In other embodiments, the circuit 150 may be a part of the circuit 104 and so the contribution of the circuit 150 to the total error may be corrected.

Figure 6:
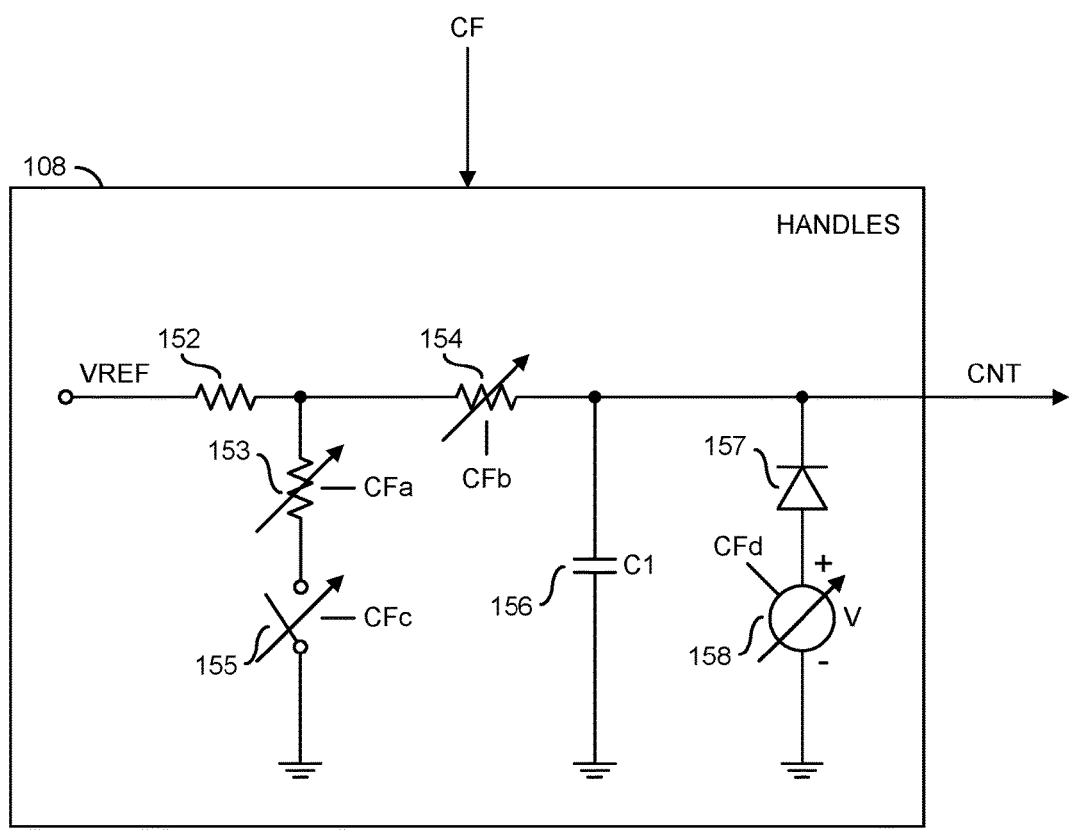
FIG. 6 is a detailed block diagram of a handles circuit.

Referring to FIG. 6, a detailed block diagram of an example implementation of the circuit 108 is shown. In the example implementation, the circuit 108 generally comprises multiple resistors 152-154, a switch 155, a capacitor 156, an optional diode 157 and an optional variable voltage source 158.

The resistor 152 may be connected between a reference voltage source (e.g., VREF) and the resistors 153 and 154. The reference voltage source VREF may generate a constant voltage (e.g., +5 volts) The other end of the resistor 153 may be connected to the switch 155. The other end of the switch 155 may be connected to ground. The other end of the capacitor 156 may be connected to ground. The other end of the resistor 154 may be connected to the capacitor 156. One end of the diode 157 may be connected to the resistor 154 and the capacitor 156. The other end of the diode 156 may be connected to the variable voltage source 158. The other end of the variable voltage source 158 is generally connected to ground. The node connecting the resistor 154, the capacitor 156 and the diode 157 may generate the signal CNT.

The resistor 152 may implement a fixed resistor (e.g., around 400 ohms). The resistor 153 may implement a variable resistor (e.g., vary around 600 ohms) as controlled by a portion of the signal CF (e.g., CFa). The resistor 154 may implement a variable resistor (e.g., vary around 10,000 ohms) as controlled by a portion of the signal CF (e.g., CFb). The switch 155 may implement a single pole single throw switch controlled by another portion of the signal CF (e.g., CFc). The capacitor 156 may implement a fixed capacitor (e.g., 0.1 microfarads). The variable voltage source 158 may be configured to generate a variable voltage in the range of VREF to above a low level (e.g., around +3 volts plus the forward voltage drop of the diode 157). The variable voltage source 158 is generally controlled by a portion fo the signal CF (e.g., CFd). A sum of the resistance values of the resistors 152 and 153 is generally smaller than a resistance value of the resistor 154 (e.g., 1:10 ratio).

The switch 155/signal CFc generally controls a timing of a control pulse in the signal CNT. When the switch 155 is closed, the signal CNT may be pulled to a low value determined by the resistors 152 and 153. An RC time constant for pulling down the signal CNT is generally controlled by the resistors 153 and 154 and the capacitor 156. When the switch 155 is opened, the signal CNT may be pulled to a high value (e.g., +5 volts) determined by the reference voltage VREF. An RC time constant to pull up the signal CNT is generally determined by the resistors 152 and 154 and the capacitor 156. The resistor 153/signal CFa may control an amplitude of the control pulse generated in the signal CNT. The resistor 154/signal CFb may control the RC time constant of the control pulse in the signal CNT.

After a certain number of pulses in a burst have been corrected by the circuit 110, no additional adjustments to the correction may be applied in some embodiments. To stop any additional changes to the corrections once the steady state condition 162 has been reached, the variable voltage source 158/signal CFd may optionally provide a clipping or clamping capability. As the voltage of the signal CNT drops due to changes in the resistors 153 and/or 154, the diode 157 becomes forward biased. Thereafter, the variable voltage source 158 may hold the signal CNT at the voltage established by the signal CFd and a forward-biased (or switch-on) voltage drop across the diode 157.

Figure 7:
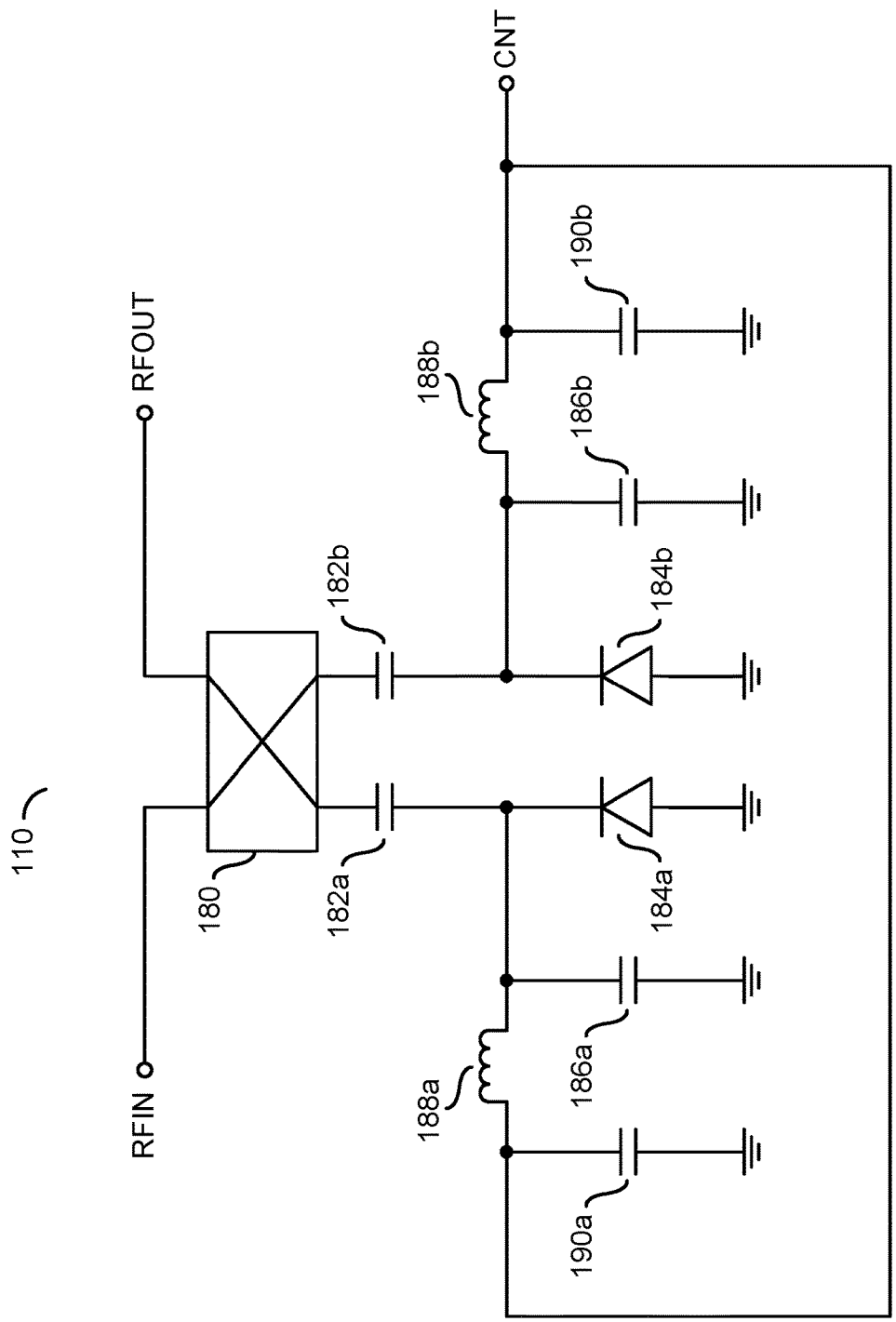
FIG. 7 is a detailed block diagram of a phase modulator circuit.

Referring to FIG. 7, a detailed block diagram of an example implementation of the circuit 110 is shown. The circuit 110 generally comprises a block (or circuit) 180, multiple capacitors 182a-182b, multiple diodes 184a-184b, multiple capacitors 186a-186b, multiple inductors 188a-188b and multiple capacitors 190a-190b.

The signal RFIN may be received by the circuit 180. The signal RFOUT may be presented from the circuit 180. The signal CNT is generally received by the inductors 188a-188b and the capacitors 190a-190b.

The circuit 180 may implement a hybrid coupler circuit. The circuit 180 is generally operational to couple the signals RFIN and RFOUT to the rest of the circuitry. In some embodiments, the circuit 180 may be implemented as a "90 degree" hybrid. A 90 degree hybrid generally means that the relative phases of the terminals differ by 90 degrees.

The diodes 184a-184b may implement varactor diodes. The diodes 184a-184b may be operational to adjust the phase of each pulse in the signal RFIN based on the shape, the amplitude and the duration of the signal CNT. DC isolation between the signal CNT and the signals RFIN and RFOUT may be provided by the capacitors 182a-182b (e.g., 8-12 picofarad each)

The capacitors 186a-186b may implement shunt capacitors. The capacitors 186a-186b may be fixed once appropriate values are selected (e.g., 1-2 picofarad) to limit the range over which the diodes 184a-184b can shift the phases of the pulses. In some embodiments, the phase shifting may be from zero degrees (no shift) to about 5 degrees.

The inductors 188a-188b (e.g., around 100 nanohenerys each) and the capacitors 190a-190b (e.g., around 27 picofarad each) may be wired as a tuned circuit that attenuates the signal RFIN and the signal RFOUT to the signal CNT. In some embodiments, the capacitors 190a and 190b may be implemented as a single combined capacitor.

The functions and structures illustrated in the diagrams of FIGS. 1, 2 and 5-7 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a circuit configured to generate a control signal based on a reference voltage and a plurality of characteristics of an amplifier; and
   a shifter configured to (i) receive an input signal carrying a pulse burst having a plurality of pulses, (ii) shift a plurality of phases of said pulses in said pulse burst in response to said control signal, and (iii) present said pulses as shifted in an output signal.

2. The apparatus according to claim 1, wherein the circuit is configured to adjust said control signal in at least one of duration, amplitude, and timing.

3. The apparatus according to claim 1, wherein at least one of a duration of said control signal is controlled by a first configuration signal received by said circuit, an amplitude of said control signal is controlled by a second configuration signal received by said circuit, and a timing of said control signal is controlled by a third configuration signal received by said circuit.

4. The apparatus according to claim 1, wherein said circuit is further configured to clamp said control signal to a constant value after a predetermined number of said pulses.

5. The apparatus according to claim 1, wherein said shifter uniquely shifts each of said phases of said pulses in said pulse burst.

6. The apparatus according to claim 1, wherein said shifter maintains an amplitude of said pulses from said input signal to said output signal.

7. The apparatus according to claim 1, wherein said shifter adjusts said phases of said pulses by varying a voltage across a plurality of diodes using said control signal.

8. The apparatus according to claim 1, wherein said circuit and said shifter form part of an amplifier circuit that operates in one or more of a super high frequency range and an extremely high frequency range.

9. A method for amplification phase correction in a pulse burst, comprising the steps of:
   generating a control signal in a circuit based on a reference voltage and a plurality of characteristics of an amplifier;
   receiving an input signal carrying a pulse burst having a plurality of pulses;
   shifting a plurality of phases of said pulses in said pulse burst in response to said control signal; and
   presenting said pulses as shifted in an output signal.

10. The method according to claim 9, further comprising the step of:
    adjusting said control signal in at least one of duration, amplitude, and timing.

11. The method according to claim 9, wherein at least one of a duration of said control signal is controlled by a first configuration signal received by said circuit, an amplitude of said control signal is controlled by a second configuration signal received by said circuit, and a timing of said control signal is controlled by a third configuration signal received by said circuit.

12. The method according to claim 9, further comprising the step of:
    clamping said control signal to a constant value after a predetermined number of said pulses.

13. The method according to claim 9, wherein each of said phases of said pulses in said pulse burst is uniquely shifted.

14. The method according to claim 9, wherein an amplitude of said pulses is maintained from said input signal to said output signal.

15. The method according to claim 9, wherein said phases of said pulses are adjusted by varying a voltage across a plurality of diodes using said control signal.

16. The method according to claim 9, wherein said steps are implemented in an amplifier circuit that operates in one or more of a super high frequency range and an extremely high frequency range.

17. An apparatus comprising:
    a circuit configured to (i) generate an input signal carrying a pulse burst having a plurality of pulses, (ii) shift a plurality of phases of said pulses in said pulse burst in response to a control signal in a first mode, (iii) bypass said shifts in a second mode, and (iv) present said pulses in an intermediate signal to an amplifier; and
    an analyzer configured to determine a plurality of characteristics of said amplifier based on an output signal generated by said amplifier.

18. The apparatus according to claim 17, wherein said circuit comprises a function generator configured to generate said control signal and a trigger signal that starts said pulse burst.

19. The apparatus according to claim 17, wherein said circuit further comprises a pulse modulator configured to generate said input signal.

20. The apparatus according to claim 17, wherein said circuit comprises a filter circuit configured to modify said control signal prior to said shifts of said phases of said pulses in said pulse burst.

* * * * *